(12) United States Patent
Yun et al.

(10) Patent No.: US 7,755,170 B2
(45) Date of Patent: Jul. 13, 2010

(54) SEMICONDUCTOR DEVICE AND SEMICONDUCTOR PACKAGE HAVING THE SAME

(75) Inventors: Yeo Song Yun, Chungcheongbuk-do (KR); Kyoung Sook Park, Gyeonggi-do (KR); Qwan Ho Chung, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 233 days.

(21) Appl. No.: 11/852,579

(22) Filed: Sep. 10, 2007

(65) Prior Publication Data

US 2008/0315369 A1 Dec. 25, 2008

(30) Foreign Application Priority Data

Jun. 21, 2007 (KR) .................. 10-2007-0061249

(51) Int. Cl.
*H01L 29/06* (2006.01)
(52) U.S. Cl. ............... 257/622; 257/690; 257/E23.002; 257/E23.193
(58) Field of Classification Search ................. 257/622, 257/690, E23.002, E23.193
See application file for complete search history.

(56) References Cited

U.S. PATENT DOCUMENTS 5,874,773 A * 2/1999 Terada et al. ................ 257/676
6,331,729 B1 * 12/2001 Yusa et al. .................. 257/678

FOREIGN PATENT DOCUMENTS

| JP | 10-144723 A | 5/1998 |
| JP | 10-173042 A | 6/1998 |
| JP | 2002-329825 A | 11/2002 |
| KR | 1020060072967 A | 6/2006 |

* cited by examiner

*Primary Examiner*—Thanh V Pham
*Assistant Examiner*—Marvin Payen
(74) *Attorney, Agent, or Firm*—Ladas & Parry LLP

(57) ABSTRACT

A semiconductor device having no voids and a semiconductor package using the same is described. The semiconductor device includes a semiconductor chip having a circuit section which is formed in a first area and a peripheral section which is formed in a second area defined around the first area, and an insulation layer covering the first and second areas and having at least one void removing part which extends from the first area to the second area to prevent a void from being formed.

4 Claims, 9 Drawing Sheets

SEMICONDUCTOR DEVICE AND SEMICONDUCTOR PACKAGE HAVING THE SAME

CROSS-REFERENCE TO RELATED APPLICATIONS

The present application claims priority to Korean patent application number 10-2007-0061249 filed on Jun. 21, 2007, which is incorporated herein by reference in its entirety.

BACKGROUND OF THE INVENTION

The present invention relates to a semiconductor device and a stacked semiconductor package having the same. More particularly, the present invention relates to a semiconductor device which has a structure adapted for removing voids, and a semiconductor package which removes voids using the same.

Recently, as semiconductor manufacturing technologies are developed, semiconductor devices capable of processing an increased amount of data in a short period have been proposed in the art.

A semiconductor device is manufactured through a semiconductor chip manufacturing process in which semiconductor chips are manufactured on a silicon wafer made of silicon having high purity, a die sorting process in which the semiconductor chips are electrically inspected, and a packaging process in which good-quality semiconductor chips are packaged.

Among these processes, the quality of a semiconductor package can be improved in the packaging process. For example, these days, a chip scale package, in which the size of a semiconductor package is no greater than about 100% to 110% of the size of a semiconductor chip, and a stacked semiconductor package, in which a plurality of semiconductor chips are stacked upon one another so as to increase the capacity and the processing speed of a semiconductor device, have been disclosed in the art.

Most semiconductor packages need adhesive members which contain insulating material, to fix a semiconductor chip to a substrate.

When attaching the semiconductor chip to the adhesive member, voids as empty spaces are frequently trapped between the adhesive member and the semiconductor chip. In particular, the voids are frequently generated in portions of a fuse box which is electrically connected with a circuit section formed in the semiconductor chip in order to repair the circuit section.

If voids are trapped between the adhesive member and the semiconductor chip, a problem is caused in that the semiconductor chip is likely to be inclined with respect to the substrate.

Also, if voids are trapped between the adhesive member and the semiconductor chip, another problem is caused in that conductive wires may not be bonded to correct positions when conducting a wire bonding process on the semiconductor chip.

Further, if voids are trapped between the adhesive member and the semiconductor chip, still another problem is caused in that, as air contained in the void expands in a subsequent hot process, the liability of the semiconductor package can be markedly degraded.

SUMMARY OF THE INVENTION

An embodiment of the present invention is directed to a semiconductor device which is substantially free of voids between a semiconductor chip and an adhesive member located on the semiconductor chip.

Another embodiment of the present invention is directed to a semiconductor package which prevents voids from being formed therein.

In one aspect, a semiconductor device comprises a semiconductor chip having a circuit section which is formed in a first area and a peripheral section which is formed in a second area defined around the first area; and an insulation layer covering the first and second areas and having at least one void removing part which extends from the first area to the second area to prevent a void from being formed.

The void removing part has the shape of a groove when viewed from the top.

The void removing part comprises an opening which exposes the semiconductor chip.

A fuse box is located in the void removing part.

The semiconductor device further comprises an adhesive film covering the first area.

The void removing part has the shape of a cross when viewed from the top.

The void removing part has the shape of a straight line when viewed from the top.

The void removing part has the shape of a lattice when viewed from the top.

In another embodiment, a semiconductor device comprises a semiconductor chip including a circuit section which is formed in a first area and fuse boxes which are discontinuously located in a second area defined around the first area and are connected with the circuit section; and an insulation layer covering the first and second areas, and having void removing parts which are formed in the second area and simultaneously expose the respective fuse boxes.

The void removing part extends to an edge of the insulation layer to communicate with the outside.

A width of the void removing part is substantially the same as that of the fuse box.

The fuse boxes are located in at least two rows along the second area.

The void removing parts are formed to correspond to the number of fuse boxes which are located in at least two rows.

An opening pattern is formed to communicate with the void removing parts which expose the respective fuse boxes located in at least two rows.

Each void removing part has a first width, and the opening pattern has a second width which is greater than the first width.

In still another embodiment, a semiconductor package comprises a substrate having connection pads and ball lands; a semiconductor chip including a circuit section which has at least one circuit area, fuse boxes which are discontinuously located in a peripheral area defined around the circuit area and are connected with the circuit section, and bonding pads which face the substrate; an insulation layer covering the circuit area and the peripheral area and having void removing parts which are formed in the peripheral area and simultaneously expose the respective fuse boxes; a bonding member for boding the insulation layer and the substrate to each other; and connection members for electrically connecting the bonding pads and the connection pads with each other.

The void removing part extends to an edge of the insulation layer to communicate with the outside.

A width of the void removing part is substantially the same as that of the fuse box.

The fuse boxes are located in at least two rows along the peripheral area.

The void removing parts are formed to correspond to the number of fuse boxes which are located in at least two rows.

An opening pattern is formed to communicate with the void removing parts which expose the respective fuse boxes located in at least two rows.

Each void removing part has a first width, and the opening pattern has a second width which is greater than the first width.

In still another embodiment, a semiconductor package comprises a base substrate having outside connection terminals; a first semiconductor device located on the base substrate, and including a first semiconductor chip which has a first area having formed therein a circuit section and a second area defined around the first area and a first insulation layer which covers the first and second areas of the first semiconductor chip and has at least one first void removing part extending from the first area to the second area; a second semiconductor device located on the first semiconductor device, and including a second semiconductor chip which has a third area having formed therein a circuit section and a fourth area defined around the third area and a second insulation layer which covers the third and fourth areas of the second semiconductor chip and has at least one second void removing part extending from the third area to the fourth area; and an adhesive member interposed between the first and second semiconductor devices.

The void removing parts formed in the first and second insulation layers which are brought into contact with the adhesive member comprise grooves and/or openings which are defined in the first and second insulation layers.

The first and second void removing parts have the shape of a cross when viewed from the top.

The first and second void removing parts have the shape of a straight line when viewed from the top.

The first and second void removing parts have the shape of a lattice when viewed from the top.

DESCRIPTION OF SPECIFIC EMBODIMENTS

Figure 1:
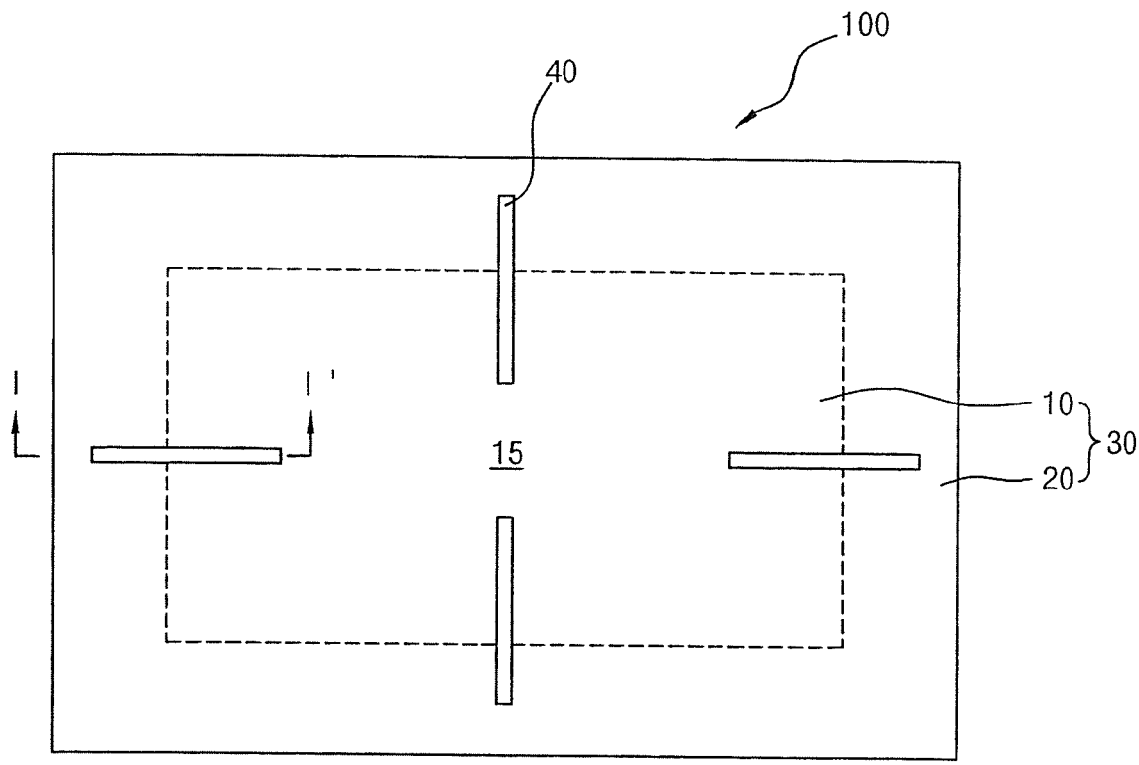
FIG. 1 is a plan view illustrating a semiconductor device in accordance with a first embodiment of the present invention.
Figure 2:
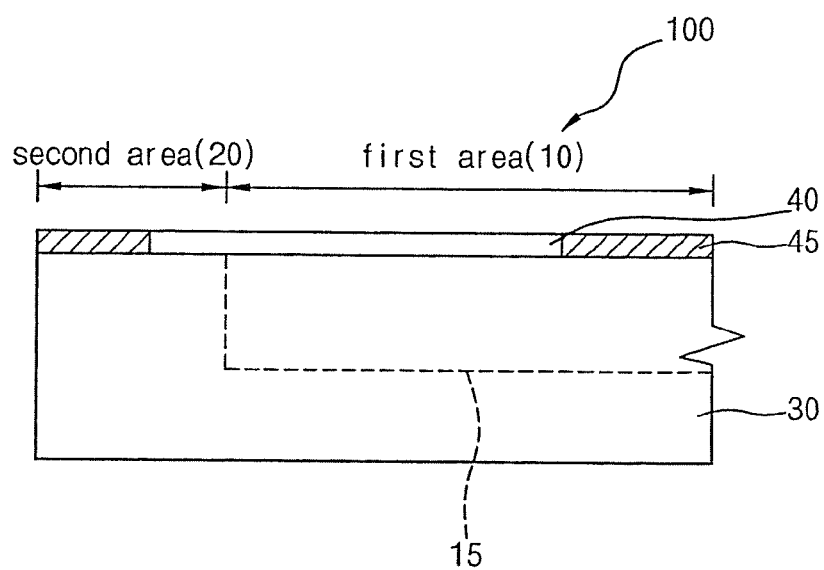
FIG. 2 is a cross-sectional view taken along the line I-I' of FIG.

FIG. 1 is a plan view illustrating a semiconductor device in accordance with a first embodiment of the present invention, and FIG. 2 is a cross-sectional view taken along the line I-I' of FIG. 1.

Referring to FIGS. 1 and 2, a semiconductor device 100 includes a semiconductor chip 30 and an insulation layer 45 (see FIG. 2) which has void removing parts 40.

In the present embodiment, the semiconductor chip 30, for example, includes a circuit section 15 which has a data storage unit (not shown) for storing data and a data processing unit (not shown) for processing data.

The circuit section 15 of the semiconductor chip 30 is located, for example, on the center portion of the semiconductor chip 30. Hereinafter, the area of the semiconductor chip 30, in which the circuit section 15 is formed, will be referred to as a first area 10, and the area around the first area 10 will be referred to as a second area 20.

An adhesive film (not shown) having a predetermined degree of adhesion can be located in the first area 10 and/or the second area 20 of the semiconductor chip 30. When the adhesive film is attached to the first area 10 and/or the second area 20, voids containing air can be formed between the adhesive film and the semiconductor chip 30.

The insulation layer 45 is located on the surface of the semiconductor chip 30, and the void removing parts 40 for preventing the generation of voids are formed in the insulation layer 45. The void removing parts 40, which are formed in the insulation layer 45, extends, for example, from the first area 10 to the second area 20.

Referring to FIG. 2, each void removing part 40 may be a slit-shaped opening which exposes the upper surface of the semiconductor chip 30.

In the present embodiment, the void removing part 40, which has the shape of a slit, extends from the first area 10 to the second area 20. Accordingly, although the edge of the adhesive film is attached to the insulation layer 45 earlier than the center portion of the adhesive film when attaching the adhesive film to the first area 10 of the insulation layer 45, the air existing between the adhesive film and the insulation layer 45 is discharged along the void removing parts 40, whereby it is possible to prevent voids from being trapped between the adhesive film and the insulation layer 45.

In the present embodiment, at least one void removing part 40 can be selectively formed in the insulation layer 45 at a position where voids are frequently generated. For example, a plurality of void removing parts 40 can be formed in a boundary region between the first area 10 and the second area 20 in which voids are frequently generated.

According to the present embodiment, by forming the void removing parts 40 through partially opening the insulation layer 45 which covers and protects the circuit section 15, it is possible to prevent voids from being formed between the semiconductor chip 30 and the adhesive film.

Figure 3:
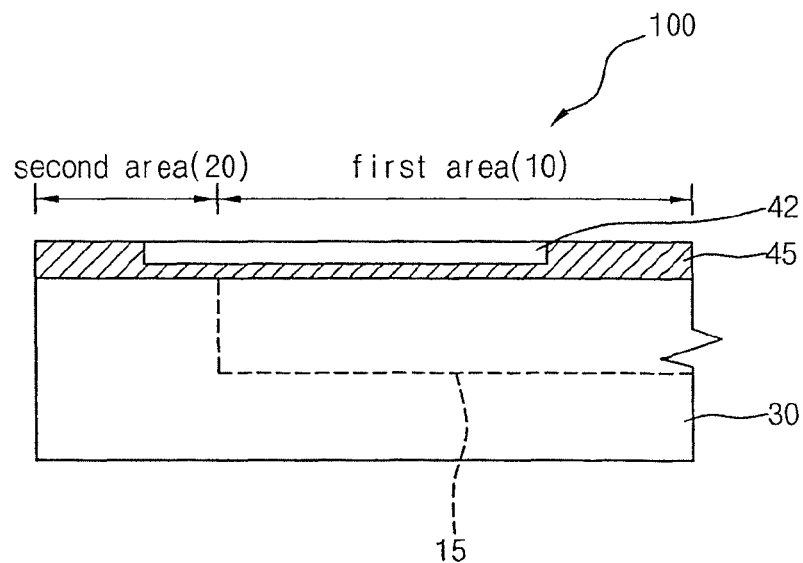
FIG. 3 is a cross-sectional view illustrating a semiconductor device in accordance with a second embodiment of the present invention.

FIG. 3 is a cross-sectional view illustrating a semiconductor device in accordance with a second embodiment of the present invention. The semiconductor device according to this second embodiment of the present invention has substantially the same construction as that of the first embodiment described above with reference to FIG. 1 except void removing parts. Therefore, the same reference numerals and terms will be used to refer to the same component elements.

Referring to FIG. 3, a semiconductor device 100 according to the present embodiment includes a semiconductor chip 30 and an insulation layer 45 which has void removing parts 42. The insulation layer 45 according to this embodiment is formed in a first area 10 and a second area 20 to insulate and protect a circuit section 15 of the semiconductor device 100. The void removing parts 42 are formed in the insulation layer 45 to remove voids which can be formed by an adhesive film (not shown) attached to the insulation layer 45 in the first area 10.

The void removing parts 42 according to the present embodiment not only prevent the circuit section 15 located under the insulation layer 45 from being exposed to the outside, but also prevent voids from being generated.

To this end, the void removing part 42 according to the present embodiment is located on the insulation layer 45 and has the shape of a groove or a recess when viewed from the top. The depth of the void removing part 42 having the shape of a groove or a recess is less than the thickness of the insulation layer 45. Preferably, the depth of the void removing part 42 can be about 10% to 90% of the thickness of the insulation layer 45.

According to the present second embodiment, by forming on the insulation layer 45 the void removing parts 42 having the depth less than the thickness of the insulation layer 45, the circuit section 15 is prevented from being partially exposed through the insulation layer 45, and voids can be effectively removed.

Figure 4:
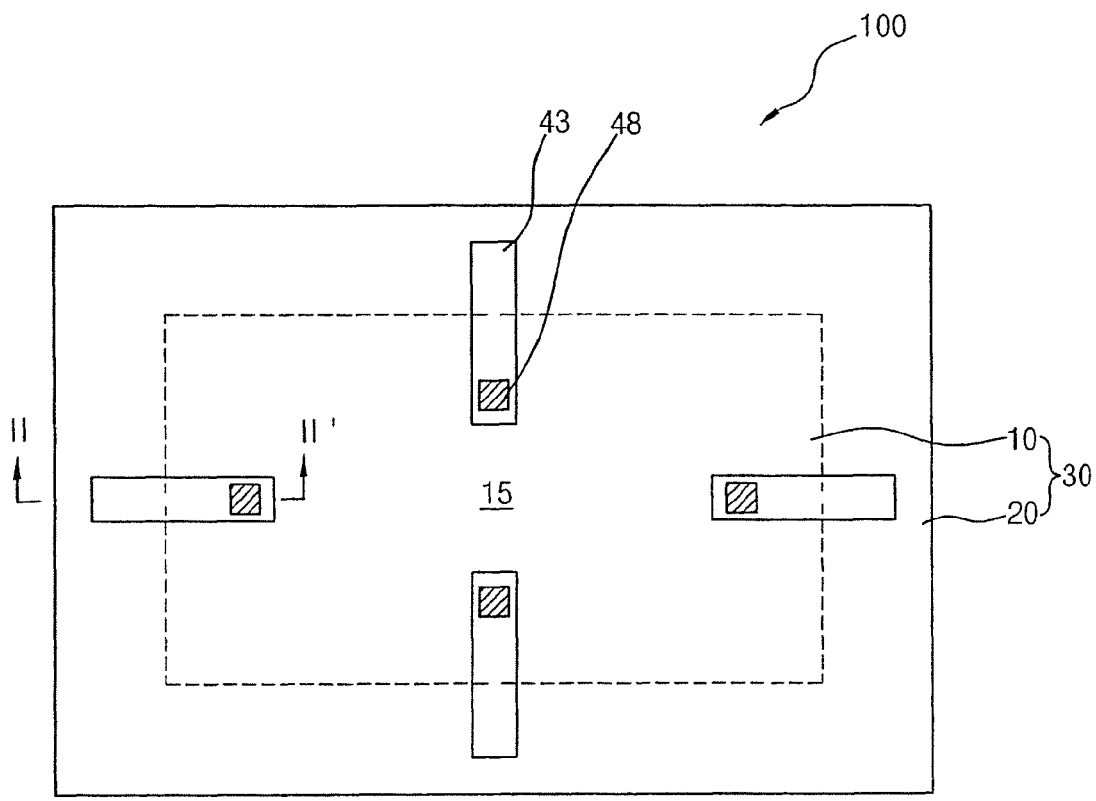
FIG. 4 is a plan view illustrating a semiconductor device in accordance with a third embodiment of the present invention.
Figure 5:
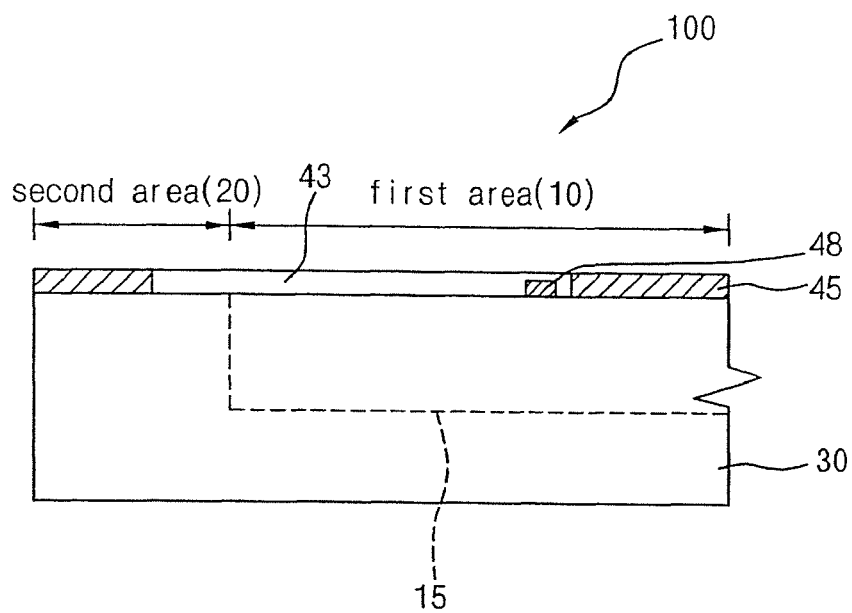
FIG. 5 is a cross-sectional view taken along the line II-II' of FIG. 4.

FIG. 4 is a plan view illustrating a semiconductor device in accordance with a third embodiment of the present invention, and FIG. 5 is a cross-sectional view taken along the line II-II' of FIG. 4.

Referring to FIGS. 4 and 5, a semiconductor device 100 includes a semiconductor chip 30 which has fuse boxes 48 and an insulation layer 45 (see FIG. 5) which has void removing parts 43.

In the present embodiment, the semiconductor chip 30 includes a circuit section 15 for storing and processing data. The circuit section 15 of the semiconductor chip 30 is located on the center portion of the semiconductor chip 30 when viewed from the top.

Hereinafter, the area of the semiconductor chip 30, in which the circuit section 15 is formed, will be referred to as a first area 10, and the area around the first area 10 will be referred to as a second area 20.

Fuse boxes 48 for repairing and inspecting the circuit section 15 are located on portions of the circuit section 15 of the semiconductor chip 30. In the present embodiment, the fuse boxes 48 can be formed in the first area 10 of the semiconductor chip 30.

The insulation layer 45 is located over the first area 10 and the second area 20 of the semiconductor chip 30. The insulation layer 45 insulates and protects the circuit section 15. Meanwhile, the insulation layer 45 has openings which are defined therein at positions corresponding to the fuse boxes 48 and which expose the fuse boxes 48.

In the present embodiment, an adhesive film (not shown) having a predetermined degree of adhesion can be located in the first area 10 of the semiconductor chip 30 in which the fuse boxes 48 are located.

Meanwhile, when the adhesive film and the semiconductor chip 30 are attached to each other, voids can be formed between the adhesive film and the openings which are defined in the insulation layer 45 to expose the fuse boxes 48 formed in the first area 10 of the semiconductor chip 30.

If the openings of the insulation layer 45 are closed by the adhesive film and voids are formed, the air contained in the voids can expand in subsequent processes and break the insulation layer 45, the semiconductor chip 30 and the adhesive film.

In the present embodiment, the void removing parts 43 for preventing voids from being generated are respectively located in portions of the insulation layer 45 which correspond to the fuse boxes 48. Each of the void removing parts 43, which are formed in the insulation layer 45, extends from the first area 10 to the second area 20. The void removing parts 43 start to extend from the openings which expose the fuse boxes 48. That is to say, the fuse boxes 48 are positioned in the respective void removing parts 43.

Referring to FIG. 4, each of the void removing parts 43 according to the present embodiment can be a slit-shaped opening which exposes the upper surface of the semiconductor chip 30.

Due to the fact that the void removing parts 43, which expose the fuse boxes 48, extend from the first area 10 to the second area 20, the air, which is trapped while the adhesive film is attached to the portion of the insulation layer 45 in the first area 10, is discharged out of the adhesive film through the void removing parts 43, by which it is possible to prevent voids from being generated between the adhesive film and the insulation layer 45.

According to the present embodiment, by forming the void removing parts 43 through partially opening the insulation layer 45 to include the fuse boxes 48 for repairing the circuit section 15, it is possible to prevent voids from being formed due to the presence of the fuse boxes 48 and the adhesive film covering the insulation layer 45.

Figure 6:
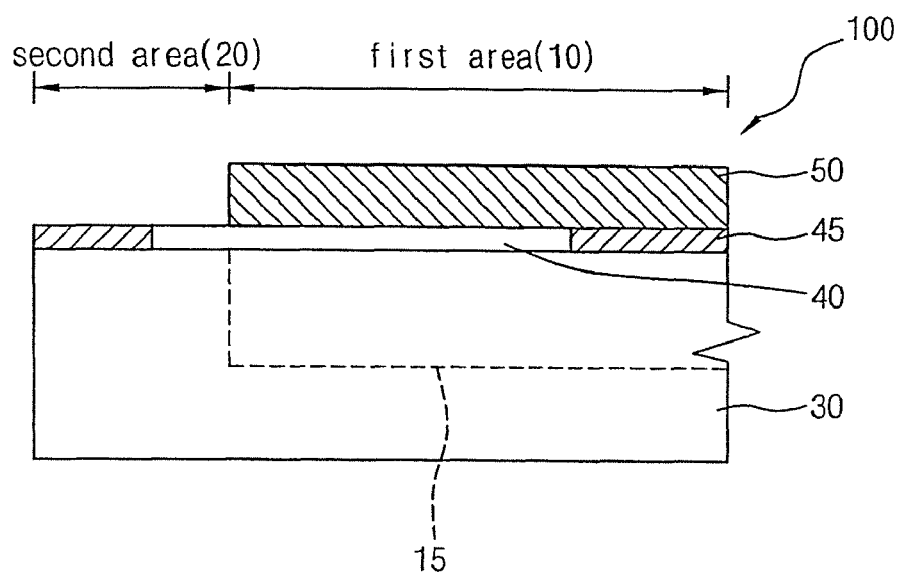
FIG. 6 is a cross-sectional view illustrating a semiconductor device in accordance with a fourth embodiment of the present invention.

FIG. 6 is a cross-sectional view illustrating a semiconductor device in accordance with a fourth embodiment of the present invention. The semiconductor device according to this fourth embodiment of the present invention has substantially the same construction as that of the first embodiment described above with reference to FIG. 1 except an adhesive film. Therefore, detailed description for the same component elements will be omitted herein, and the same reference numerals will be used to refer to the same component elements.

Referring to FIG. 6, a semiconductor device 100 includes a semiconductor chip 30, an insulation layer 45 which has a void removing part 40, and an adhesive film 50.

The adhesive film 50 has high electrical resistance as well as a predetermined degree of adhesion. The adhesive film 50 having high electrical resistance and a predetermined degree of adhesion can be selectively attached to the first area 10 of the semiconductor chip 30.

In the present embodiment, due to the fact that the adhesive film 50 is located in the first area 10 of the semiconductor chip 30, the semiconductor device 100 can have a plurality of semiconductor chips 30 which are stacked upon one another.

Figure 7:
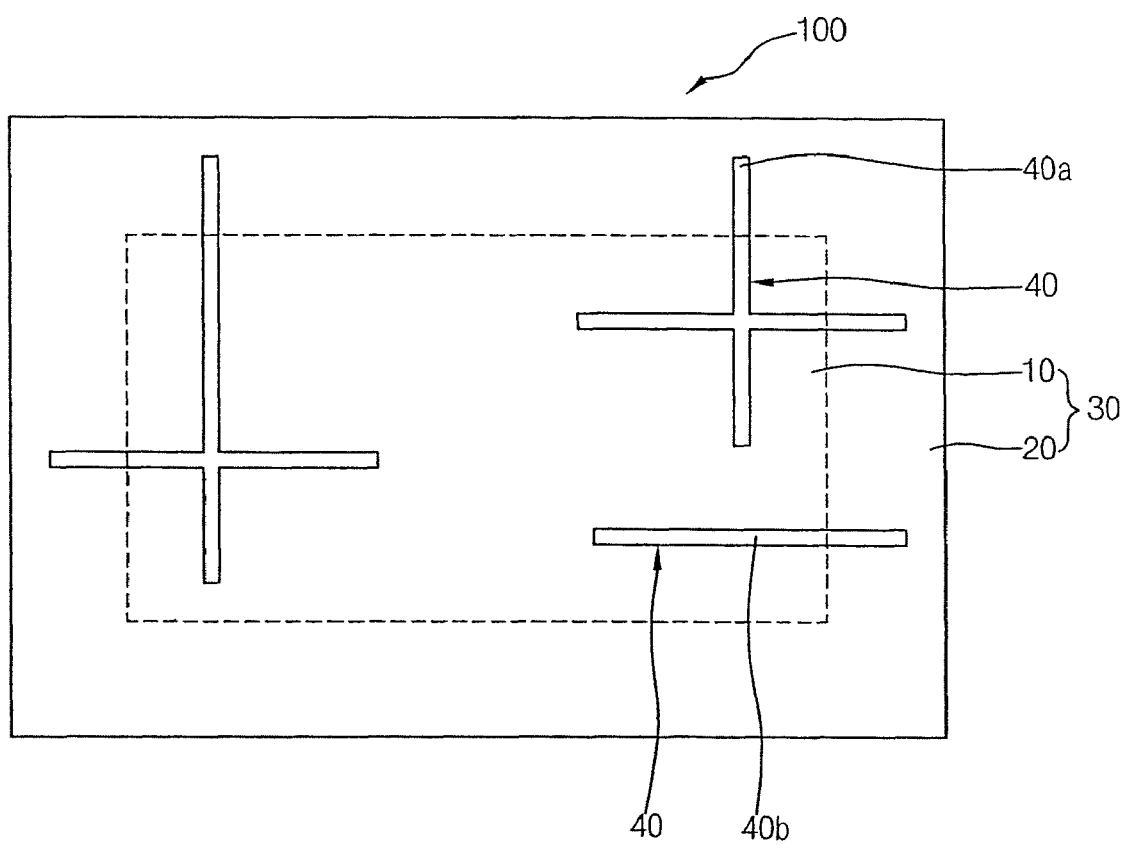
FIG. 7 is a plan view illustrating a semiconductor device in accordance with a fifth embodiment of the present invention.

FIG. 7 is a plan view illustrating a semiconductor device in accordance with a fifth embodiment of the present invention. The semiconductor device according to this fifth embodiment of the present invention has substantially the same construction as that of the first embodiment described above with reference to FIG. 1 except the shape of void removing parts. Therefore, detailed description of the same component elements will be omitted herein, and the same reference numerals will be used to refer to the same component elements.

Referring to FIG. 7, void removing parts 40 can have the shape of a cross when viewed from the top. The void removing part 40a having the shape of a cross can be formed in the corner of the first area 10 of an insulation layer 45 where voids are frequently generated. On the other hand, the void removing parts 40 can have the shape of a bar when viewed from the top. Since the void removing part 40b having the shape of a bar has a simple structure, the air contained in voids can be easily discharged.

Figure 8:
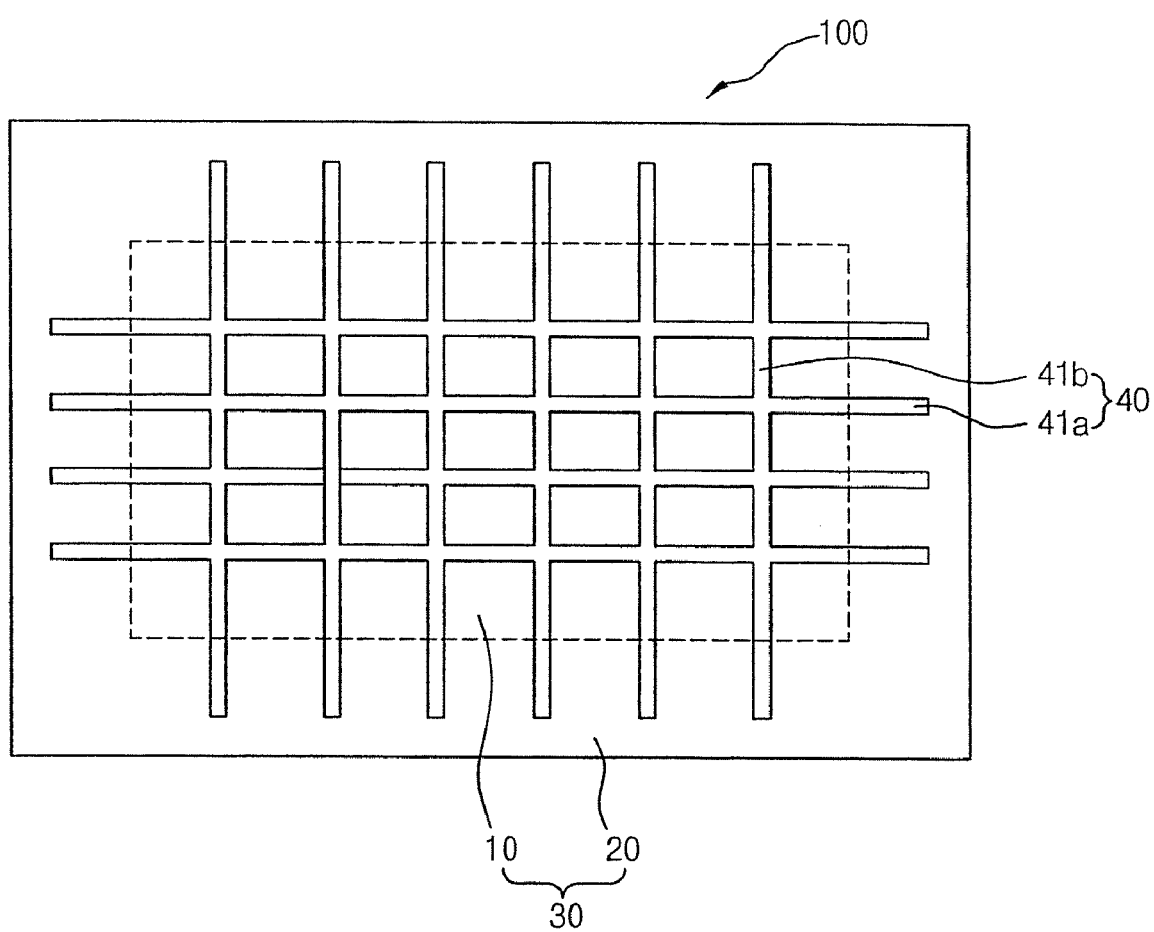
FIG. 8 is a plan view illustrating a semiconductor device in accordance with a sixth embodiment of the present invention.

FIG. 8 is a plan view illustrating a semiconductor device in accordance with a sixth embodiment of the present invention. The semiconductor device according to this sixth embodiment of the present invention has substantially the same construction as that of the first embodiment described above with reference to FIG. 1 except the shape of void removing parts. Therefore, detailed description of the same component elements will be omitted herein, and the same reference numerals will be used to refer to the same component elements.

Referring to FIG. 8, the void removing part 40 of a semiconductor device 100 is formed in a manner such that slit-shaped transverse and longitudinal openings 41a and 41b, which extend through a first area 10 of an insulation layer 45 to predetermined positions in a second area 20, are crossed with each other. For example, when viewed from the top, the void removing part 40 has the shape of a lattice.

Because the transverse and longitudinal openings 41a and 41b of the void removing part 40 having the shape of a lattice are formed in the first area 10 as a whole, for example, at regular intervals, even when a void is generated at any position on the insulation layer 45, the air contained in the void can be easily discharged to the second area 20.

Figure 9:
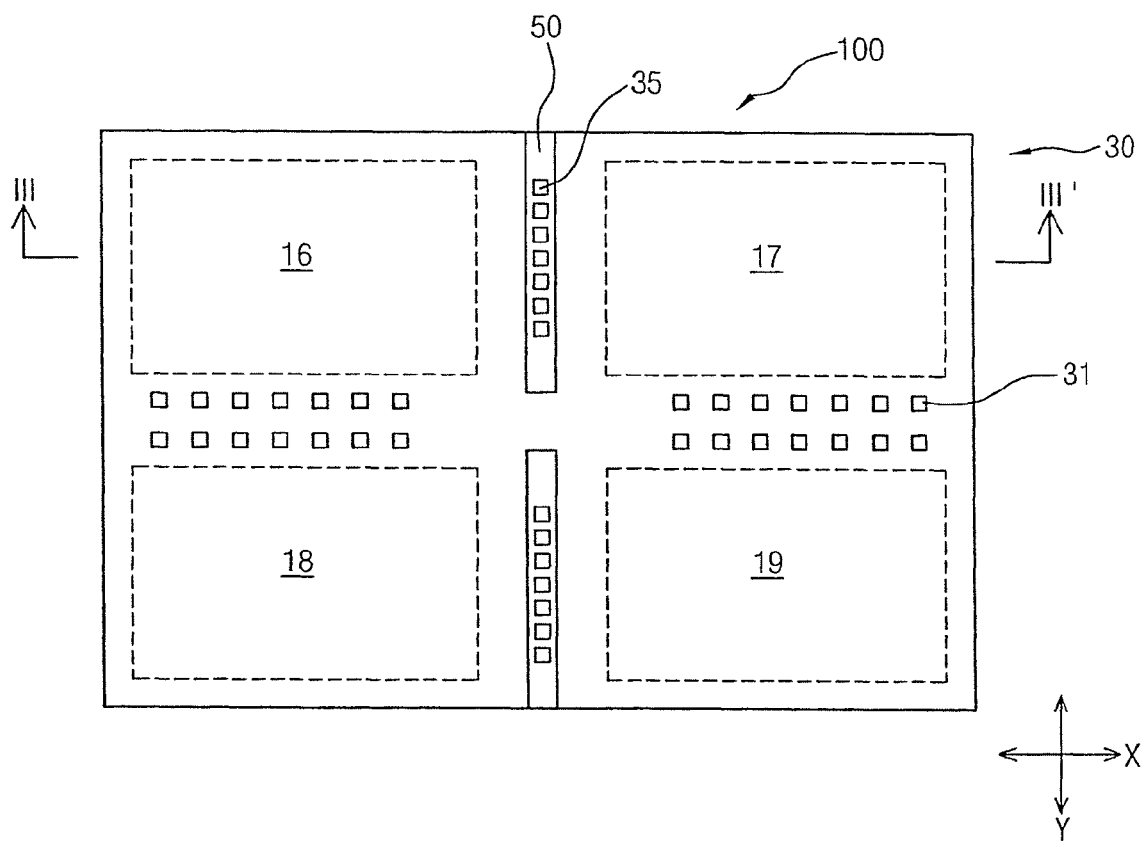
FIG. 9 is a plan view illustrating a semiconductor device in accordance with a seventh embodiment of the present invention.
Figure 10:
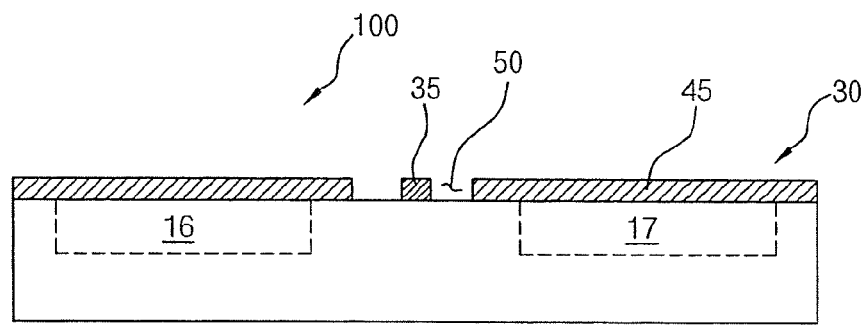
FIG. 10 is a cross-sectional view taken along the line III-III' of FIG. 9.

FIG. 9 is a plan view illustrating a semiconductor device in accordance with a seventh embodiment of the present invention, and FIG. 10 is a cross-sectional view taken along the line III-III' of FIG. 9.

Referring to FIGS. 9 and 10, a semiconductor device 100 includes a semiconductor chip 30, and an insulation layer 45 which has void removing parts 50.

The semiconductor chip 30 has circuit sections 16, 17, 18 and 19, fuse boxes 35, and bonding pads 31.

For example, the circuit sections are composed of a first circuit section 16, a second circuit section 17, a third circuit section 18, and a fourth circuit section 19. The first through fourth circuit sections 16, 17, 18 and 19 are located in the shape of a matrix. As an example, the circuit sections 16, 17, 18 and 19 are located in the shape of a 2×2 matrix. The second circuit section 17 is located adjacent to the first circuit section 16, and the fourth circuit section 19 is located adjacent to the third circuit section 18. Also, the first and fourth circuit sections 16 and 19 are located in a diagonal direction, and the second and third circuit sections 17 and 18 are located in a diagonal direction.

Hereinafter, the respective areas, in which the circuit sections 16, 17, 18 and 19 are formed, will be referred to as first areas, and the area around the circuit sections 16, 17, 18 and 19 will be referred to as a second area.

Each of the fuse boxes 35 includes a plurality of fuses. In the present embodiment, in each fuse box 35, the plurality of fuses are discontinuously formed. The fuses of the fuse boxes 35 are used to repair the first and second circuit sections 16 and 17 and the third and fourth circuit sections 18 and 19. In order to ensure that the first and second circuit sections 16 and 17 and the third and fourth circuit sections 18 and 19 are repaired using the fuses of the fuse boxes 35, the fuses of the fuse boxes 35 are located along the Y-axis between the first and second circuit sections 16 and 17 and between the third and fourth circuit sections 18 and 19.

In the present embodiment, the fuses of the fuse boxes 35, which are discontinuously located, are arranged in line. Alternatively, the fuses of the fuse boxes 35 can be located in a zigzag pattern when viewed from the top.

The bonding pads 31 are located along the X-axis between the first and third circuit sections 16 and 18 and between the second and fourth circuit sections 17 and 19. The bonding pads 31 are electrically connected with the first through fourth circuit sections 16, 17, 18 and 19.

Referring to FIG. 10, the insulation layer 45 is located on the semiconductor chip 30 which has the circuit sections 16, 17, 18 and 19, the fuse boxes 35 and the bonding pads 31. The insulation layer 45 functions to insulate and protect the semiconductor chip 30. The insulation layer 45 can be made of an oxide layer and/or a nitride layer. Alternatively, the insulation layer 45 can be made of an organic layer.

The insulation layer 45 includes the void removing parts 50. For example, each of the void removing parts 50 comprises a slit-shaped opening. The void removing parts 50 are selectively formed in the second area to prevent voids from being formed in the fuse boxes 35 which are discontinuously located.

The void removing parts 50 simultaneously open the fuse boxes 35 which are discontinuously formed. The first ends of the void removing parts 50 extend to the edges of the insulation layer 45 to allow the void removing parts 50 to serve as passages which communicate with the outside. Alternatively, it can be envisaged that the first ends of the void removing parts 50 extend to the edges of the insulation layer 45 and the second ends of the void removing parts 50 extend to the center portions of the first through fourth circuit sections 16, 17, 18 and 19 in the insulation layer 45.

In the present embodiment, the width of each void removing part 50 can be substantially the same as the width of each fuse box 35. Alternatively, the width of each void removing part 50 can be no greater than the width of each fuse box 35. By forming the void removing part 50 to have the width no greater than the width of each fuse box 35, it is possible to prevent a molding material, etc. from being introduced into the void removing parts 50 in a subsequent process.

Figure 11:
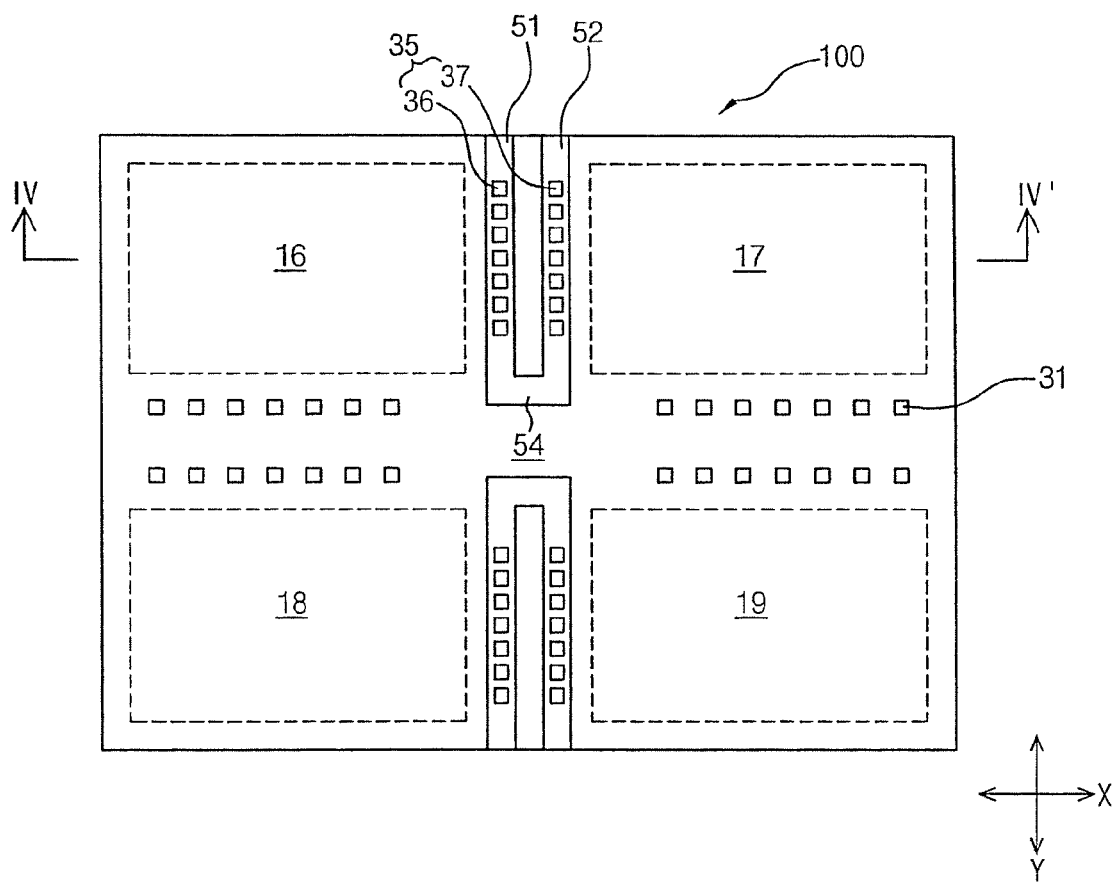
FIG. 11 is a plan view illustrating a semiconductor device in accordance with an eighth embodiment of the present invention.
Figure 12:
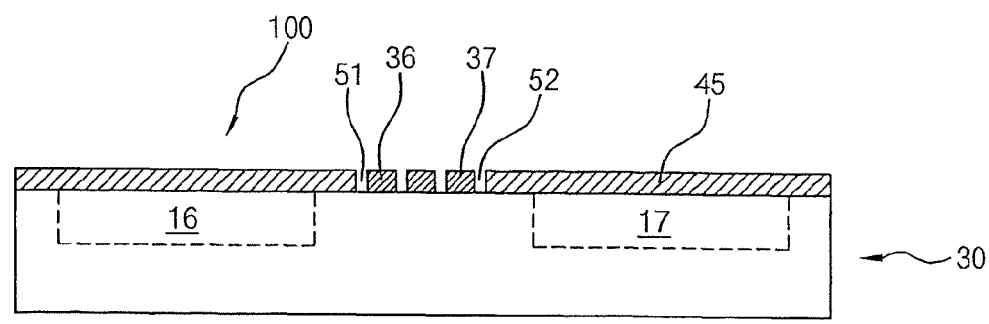
FIG. 12 is a cross-sectional view taken along the line IV-IV' of FIG. 11.

FIG. 11 is a plan view illustrating a semiconductor device in accordance with an eighth embodiment of the present invention, and FIG. 12 is a cross-sectional view taken along the line IV-IV' of FIG. 11.

Referring to FIGS. 11 and 12, a semiconductor device 100 includes a semiconductor chip 30, and an insulation layer 45 which has void removing parts 51 and 52.

The semiconductor chip 30 has circuit sections 16, 17, 18 and 19, fuse boxes 35, and bonding pads 31.

For example, the circuit sections are composed of a first circuit section 16, a second circuit section 17, a third circuit section 18, and a fourth circuit section 19. The first through fourth circuit sections 16, 17, 18 and 19 are located in the shape of a matrix. As an example, the circuit sections 16, 17, 18 and 19 are located in the shape of a 2×2 matrix. The second circuit section 17 is located adjacent to the first circuit section 16, and the fourth circuit section 19 is located adjacent to the third circuit section 18. Also, the first and fourth circuit sections 16 and 19 are located in a diagonal direction, and the second and third circuit sections 17 and 18 are located in a diagonal direction.

Hereinafter, the respective areas, in which the circuit sections 16, 17, 18 and 19 are formed, will be referred to as first areas, and the area around the circuit sections 16, 17, 18 and 19 will be referred to as a second area.

Each of the fuse boxes 35 includes a plurality of fuses 36 and 37. In the present embodiment, in each fuse box 35, the plurality of fuses 36 and 37 are discontinuously formed. The fuses 36 and 37 of the fuse boxes 35 are used to repair the first and second circuit sections 16 and 17 and the third and fourth circuit sections 18 and 19.

In order to ensure that the first and second circuit sections 16 and 17 and the third and fourth circuit sections 18 and 19 are repaired using the fuses 36 and 37 of the fuse boxes 35, the fuses 36 and 37 of the fuse boxes 35 are located along the Y-axis between the first and second circuit sections 16 and 17 and between the third and fourth circuit sections 18 and 19.

In the present embodiment, the fuses 36 and 37 of the fuse boxes 35, which are discontinuously located, can be arranged in at least two rows. In the present embodiment, for example, the fuses 36 and 37 of the fuse boxes 35 are arranged in two rows.

The bonding pads 31 are located along the X-axis between the first and third circuit sections 16 and 18 and between the second and fourth circuit sections 17 and 19. The bonding pads 31 are electrically connected with the first through fourth circuit sections 16, 17, 18 and 19.

Referring to FIG. 11, the insulation layer 45 is located on the semiconductor chip 30 which has the circuit sections 16, 17, 18 and 19, the fuse boxes 35 and the bonding pads 31. The insulation layer 45 functions to insulate and protect the semiconductor chip 30. The insulation layer 45 can be made of an oxide layer and/or a nitride layer. Alternatively, the insulation layer 45 can be made of an organic layer.

The insulation layer 45 includes the void removing parts 51 and 52. For example, the void removing parts 51 and 52 comprise slit-shaped openings. The void removing parts 51 and 52 are selectively formed in the second area to prevent voids from being formed in the fuses 36 and 37 which are discontinuously located. In the present embodiment, the void removing parts 51 and 52 can be formed in correspondence with the number of the rows of the fuses 36 and 37. In the present embodiment, since the fuses 36 and 37 are formed in two rows, the void removing parts 51 and 52 are also formed in two rows.

The void removing parts 51 and 52 simultaneously open the plurality of fuses 36 and 37 which are discontinuously formed. The first ends of the void removing parts 51 and 52 extend to the edges of the insulation layer 45 to allow the void removing parts 51 and 52 to serve as passages which communicate with the outside.

In the present embodiment, the width of each of the void removing parts 51 and 52 can be substantially the same as the width of each of the fuses 36 and 37. Alternatively, the width of each of the void removing parts 51 and 52 can be no greater than the width of each of the fuses 36 and 37. By forming the void removing parts 51 and 52 to have the width no greater than the width of the fuses 36 and 37, it is possible to prevent a molding material, etc. from being introduced into the void removing parts 51 and 52 in a subsequent process.

Meanwhile, it can be envisaged that the first ends of the void removing parts 51 and 52 extend to the edges of the insulation layer 45 and the second ends of the void removing parts 51 and 52 which face away from the first ends include an opening pattern 54 which extends to the center portions of the first through fourth circuit sections 16, 17, 18 and 19 in the insulation layer 45.

In the present embodiment, the void removing parts 51 and 52 have a first width, and the opening pattern 54 can have a second width which is greater than the first width.

Figure 13:
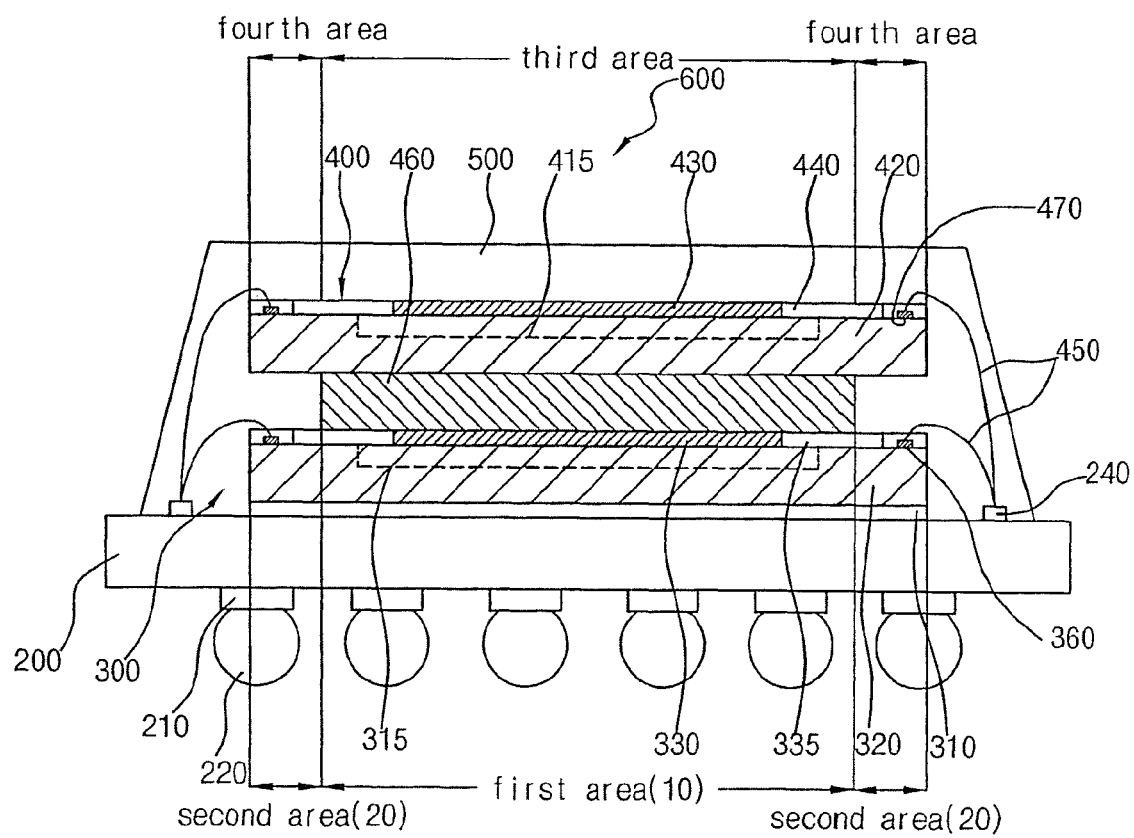
FIG. 13 is a cross-sectional view illustrating a semiconductor package in accordance with a ninth embodiment of the present invention.

FIG. 13 is a cross-sectional view illustrating a semiconductor package in accordance with a ninth embodiment of the present invention.

Referring to FIG. 13, a semiconductor package 600 includes a base substrate 200, a first semiconductor device 300, a second semiconductor device 400, and a molding member 500.

The base substrate 200 comprises a plate which has the shape of a substantially rectangular hexahedron. For example, the base substrate 200 may comprise a printed circuit board (PCB). A plurality of ball lands 210 are formed on the lower surface of the base substrate 200, and conductive balls 220 containing solder are electrically connected to the respective ball lands 210. Connection pads 240 which correspond to the ball lands 210 are formed on the upper surface of the base substrate 200 which faces away from the lower surface.

The first semiconductor device 300 is mounted to the upper surface of the base substrate 200. For example, the first semiconductor device 300 is attached to the upper surface of the base substrate 200 by an adhesive member 310. First bonding pads 360 are located adjacent to the edges of the first semiconductor device 300.

The first semiconductor device 300 includes a first semiconductor chip 320 having a first area in which a circuit section 315 is formed and a second area which is defined around the first area, and a first insulation layer 330 covering the first and second areas of the first semiconductor chip 320 and having first void removing parts 335 which extend from the first area to the second area.

In the present embodiment, the first void removing parts 335 can have the shape of a straight line or a cross when viewed from the top.

The second semiconductor device 400 is located on the first semiconductor device 300. The second semiconductor device 400 includes a second semiconductor chip 420 having a third area in which a circuit section 415 is formed and a fourth area which is defined around the third area, and a second insulation layer 430 covering the third and fourth areas of the second semiconductor chip 420 and having second void removing parts 440 which extend from the third area to a predetermined location in the fourth area. Second bonding pads 470 are located adjacent to the edges of the second semiconductor device 400.

In the present embodiment, the second void removing parts 440 can have the shape of a straight line or a cross when viewed from the top.

A spacer 460 is interposed between the first semiconductor device 300 and the second semiconductor device 400 to space apart and insulate the first and second semiconductor devices 300 and 400 from each other.

For example, in the present embodiment, the spacer 460 can be selectively located to correspond to the first area of the first semiconductor device 300 and the third area of the second semiconductor device 400.

When the spacer 460 is attached to the first area of the semiconductor device 300, if the edge of the spacer 460 is attached to the first semiconductor device 300 earlier than the center portion of the spacer 460, voids containing air can be generated. However, since the air which generates the voids is discharged to the outside along the first void removing parts 335 which extend from the first area to the second area of the first semiconductor device 300, voids are not generated in the first area to which the spacer 460 is attached.

In the meanwhile, the first and second bonding pads 360 and 470, which are formed on the first and second semiconductor devices 300 and 400, are electrically connected with the connection pads 240 which are formed on the base substrate 200, via conductive wires 450.

The molding member 500 covers and protects the first and second semiconductor devices 300 and 400 which are located on the base substrate 200. In the present embodiment, the molding member 500 may contain synthetic epoxy resin which covers and protects the first and second semiconductor devices 300 and 400.

Figure 14:
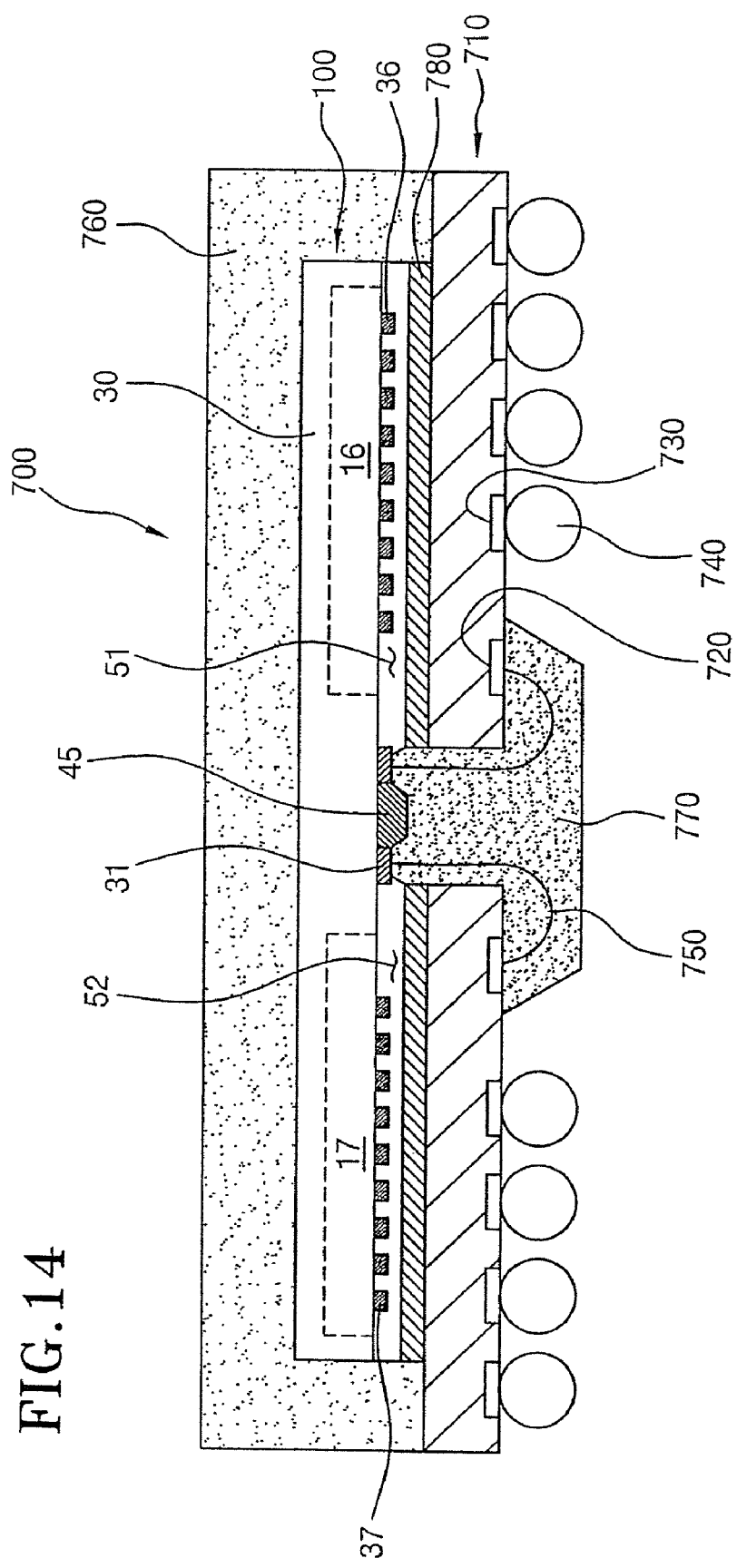
FIG. 14 is a cross-sectional view illustrating a semiconductor package in accordance with a tenth embodiment of the present invention.

FIG. 14 is a cross-sectional view illustrating a semiconductor package in accordance with a tenth embodiment of the present invention.

Referring to FIG. 14, a semiconductor package 700 includes a substrate 710, a semiconductor device 100, a first molding member 760, and a second molding member 770.

The substrate 710 has connection pads 720 and ball lands 730 and conduction balls 740. In the present embodiment, the substrate 710 can comprise a printed circuit board (PCB). A through-hole is defined in the center portion of the substrate 710. The through-hole is defined at a position which corresponds to the bonding pads 31 of the semiconductor device 100 which will be described later.

The connection pads 720 and the ball lands 730 are formed on the same surface of the substrate 710, for example, on the lower surface of the substrate 710. The connection pads 720 are located on both sides of the through-hole of the substrate 710, and the ball lands 730 are located outside the connection pads 720.

An adhesive member 780 is located on the substrate 710. The adhesive member 780 is located on the upper surface of the substrate 710 which faces away from the lower surface on which the connection pads 720 and the ball lands 730 are located. A through-hole which communicates with the through-hole of the substrate 710 is defined at a position on the adhesive member 780 which corresponds to the through-hole of the substrate 710.

Referring to FIGS. 11 and 14, the semiconductor device 100 includes a semiconductor chip 30, and an insulation layer 45 which has void removing parts 51 and 52.

The semiconductor chip 30 has circuit sections 16, 17, 18 and 19, fuses 36 and 37, and bonding pads 31.

For example, the circuit sections are composed of a first circuit section 16, a second circuit section 17, a third circuit section 18, and a fourth circuit section 19. The first through fourth circuit sections 16, 17, 18 and 19 are located in the shape of a matrix. As an example, the circuit sections 16, 17, 18 and 19 are located in the shape of a 2×2 matrix. The second circuit section 17 is located adjacent to the first circuit section 16, and the fourth circuit section 19 is located adjacent to the third circuit section 18. Also, the first and fourth circuit sections 16 and 19 are located in a diagonal direction, and the second and third circuit sections 17 and 18 are located in a diagonal direction.

Hereinafter, the respective areas, in which the circuit sections 16, 17, 18 and 19 are formed, will be referred to as first areas, and the area around the circuit sections 16, 17, 18 and 19 will be referred to as a second area.

Each of fuse boxes 35 is composed of a plurality of fuses 36 and 37. In the present embodiment, the plurality of fuses 36 and 37 are discontinuously formed. The fuses 36 and 37 are used to repair the first and second circuit sections 16 and 17 and the third and fourth circuit sections 18 and 19.

In order to ensure that the first and second circuit sections 16 and 17 and the third and fourth circuit sections 18 and 19 are repaired using the fuses 36 and 37 of the fuse boxes 35, the fuses 36 and 37 of the fuse boxes 35 are located along the Y-axis between the first and second circuit sections 16 and 17 and between the third and fourth circuit sections 18 and 19.

In the present embodiment, the fuses 36 and 37 of the fuse boxes 35, which are discontinuously located, can be arranged in at least two rows. In the present embodiment, for example, the fuses 36 and 37 of the fuse boxes 35 are arranged in two rows.

The bonding pads 31 are located along the X-axis between the first and third circuit sections 16 and 18 and between the second and fourth circuit sections 17 and 19. The bonding pads 31 are electrically connected with the first through fourth circuit sections 16, 17, 18 and 19.

The insulation layer 45 is located on the semiconductor chip 30 which has the circuit sections 16, 17, 18 and 19, the fuse boxes 35 and the bonding pads 31. The insulation layer 45 functions to insulate and protect the semiconductor chip 30. The insulation layer 45 can be made of an oxide layer and/or a nitride layer. Alternatively, the insulation layer 45 can be made of an organic layer.

The insulation layer 45 includes the void removing parts 51 and 52. For example, the void removing parts 51 and 52 comprise slit-shaped openings. The void removing parts 51 and 52 are selectively formed in the second area to prevent voids from being formed in the fuses 36 and 37 which are discontinuously located. In the present embodiment, the void removing parts 51 and 52 can be formed in correspondence with the number of the rows of the fuses 36 and 37. In the present embodiment, since the fuses 36 and 37 are formed in two rows, the void removing parts 51 and 52 are also formed in two rows.

The void removing parts 51 and 52 simultaneously open the plurality of fuses 36 and 37 which are discontinuously formed. The first ends of the void removing parts 51 and 52 extend to the edges of the insulation layer 45 to allow the void removing parts 51 and 52 to serve as passages which communicate with the outside.

In the present embodiment, the width of each of the void removing parts 51 and 52 can be substantially the same as the width of each of the fuses 36 and 37. Alternatively, the width of each of the void removing parts 51 and 52 can be no greater than the width of each of the fuses 36 and 37. By forming the void removing parts 51 and 52 to have the width no greater than the width of the fuses 36 and 37, it is possible to prevent a molding material, etc. from being introduced into the void removing parts 51 and 52 in a subsequent process.

Meanwhile, it can be envisaged that the first ends of the void removing parts 51 and 52 extend to the edges of the insulation layer 45 and the second ends of the void removing parts 51 and 52 which face away from the first ends extend to the center portions of the first through fourth circuit sections 16, 17, 18 and 19 in the insulation layer 45. Hereafter, the second ends of the void removing parts 51 and 52 will be defined as an opening pattern 54.

In the present embodiment, the void removing parts 51 and 52 have a first width, and the opening pattern 54 can have a second width which is greater than the first width.

Referring to FIG. 14, the bonding pads 31 of the semiconductor device 100 are electrically connected with the connection pads 720 of the substrate 710. In the present embodiment, the bonding pads 31 and the connection pads 720 can be electrically connected with each other, for example, by way of conductive wires 750.

The first molding member 760 covers the semiconductor device 100 so that the semiconductor device 100 is prevented from being broken by shock and/or vibration applied externally.

The second molding member 770 covers the bonding pads 31 and the conductive wires 750 which are exposed through the through-hole defined in the substrate 710, and electrically protects and insulates the conductive wires 750.

As is apparent from the above description, the present invention provides advantages in that it is possible to prevent voids from being formed between a semiconductor device and an adhesive film for stacking the semiconductor device on a substrate or another semiconductor device.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor device comprising:
    a semiconductor chip having a circuit section which is formed in a first area and a peripheral section which is formed in a second area defined around the first area; and
    an insulation layer covering the first and second areas and having at least one void removing part formed at the insulation layer, the void removing part extending from the first area to the second area to prevent a void from being formed, wherein the void removing part has a groove shape or an opening that exposes the semiconductor chip when viewed from above the device.

2. The semiconductor device according to claim 1, further comprising: an adhesive film covering the first area.

3. The semiconductor device according to claim 1, wherein the void removing part has a cross shape or a straight line shape when viewed from above the device.

4. The semiconductor device according to claim 1, wherein the void removing part has a lattice shape when viewed from the above the device.

* * * * *